United States Patent [19]
Abe

[11] Patent Number: 5,274,660
[45] Date of Patent: Dec. 28, 1993

[54] SEMICONDUCTOR DEVICE AND METHOD OF MAKING IT

[75] Inventor: Yuji Abe, Amagasaki, Japan

[73] Assignee: Mitsubishi Denki Kabushiki Kaisha, Tokyo, Japan

[21] Appl. No.: 946,110

[22] Filed: Sep. 17, 1992

[30] Foreign Application Priority Data

Sep. 20, 1991 [JP] Japan .................................. 3-241169

[51] Int. Cl.⁵ .................................................. H01S 3/08
[52] U.S. Cl. ........................................ 372/96; 372/45; 437/129
[58] Field of Search ........................... 372/96, 45, 46; 437/129, 133, 247, 90

[56] References Cited

U.S. PATENT DOCUMENTS

| | | | |
|---|---|---|---|
| 4,847,857 | 7/1989 | Ohkura | 372/96 |
| 4,894,835 | 1/1990 | Uomi et al. | 372/45 |
| 5,020,072 | 5/1991 | Abe et al. | 372/96 |
| 5,023,198 | 6/1991 | Strege | 372/96 |

FOREIGN PATENT DOCUMENTS

| | | | |
|---|---|---|---|
| 0390614 | 10/1990 | European Pat. Off. | |
| 0046083 | 3/1984 | Japan | 372/96 |
| 0119887 | 7/1984 | Japan | 372/96 |
| 0084583 | 4/1987 | Japan | 372/96 |
| 0213383 | 9/1988 | Japan | 372/96 |
| 271573 | 3/1990 | Japan | |
| 2298091 | 12/1990 | Japan | |
| 3110885 | 5/1991 | Japan | |

OTHER PUBLICATIONS

Morthier et al., "A new DFB-Laser Diode With Reduced Spatial Hole Burning", IEEE Photonics Technology Letters, vol. 2, No. 6, Jun. 1990, pp. 388-390.
Itaya et al., "New 1.5 μm Wavelength GaInAsP/InP Distributed Feedback Laser", Electronics Letters, vol. 18, No. 23, Nov. 1982, pp. 1006-1008.

*Primary Examiner*—Georgia Y. Epps
*Attorney, Agent, or Firm*—Leydig, Voit & Mayer

[57] ABSTRACT

A semiconductor laser includes an active layer and a cladding layer disposed on the active layer and made of a semiconductor material having a larger energy band than the material of the active layer. A diffraction grating layer is disposed within the cladding layer close to the active layer. The diffraction grating layer has a multi-layer structure including a stack of sub-layers of a plurality of semiconductor materials which can be selectively etched. An optical resonator is formed by the active layer, the cladding layer, and first and second cladding layers sandwiching the active layer. The diffraction grating layer includes a portion in which the number of the sub-layers in different from the number of the sub-layers elsewhere whereby different coupling coefficients are present along the axial direction of the optical resonator.

9 Claims, 2 Drawing Sheets

SEMICONDUCTOR DEVICE AND METHOD OF MAKING IT

This invention relates generally to a semiconductor device and a method of making it. More particularly, this invention relates to a semiconductor device including a semiconductor diffraction grating therein, in particular, a distributed feedback type (DFB) semiconductor laser for use as a light source in a long-distance, wide band optical communications system, and also to a method of making such a semiconductor device.

BACKGROUND OF THE INVENTION

Conventional semiconductor lasers which may be used as a light source in an optical communications system include, for example, a distributed feedback type (DFB) semiconductor laser which is described by Y. Itaya et al. in *Electronics Letters*, Vol. 18, No. 23, Page 1006 (1982). The DFB semiconductor laser disclosed in this publication includes a diffraction grating formed within the crystalline resonator of the laser. This semiconductor laser can oscillate in a single longitudinal mode at room temperature.

FIG. 3 shows, in cross-section, a basic structure of a DFB semiconductor laser, generally indicated by a reference numeral 30, disclosed in the above-cited publication. In FIG. 3, reference numeral 1 denotes an N-type conductivity (hereinafter referred to as N-type) InP substrate on which an N-type InP cladding layer 2, and InGaAsP active layer 3, a P-type conductivity (hereinafter referred to P-type) InGaAsP diffraction grating layer 50, and a P-type InP cladding layer 70 are stacked in the named order. The cladding layer 2, the active layer 3, the diffraction grating layer 50, and the cladding layer 70 form an optical resonator. A P+-type InGaAsP contact layer 8 is disposed on the P-type InP cladding layer. On the top and bottom surfaces of the thus formed stack, that is, on the top surface of the contact layer 8 and on the bottom surface of the substrate 1, there are disposed a P-side electrode 9 and an N-side electrode 10, respectively. In the surface of the P-type InGaAsP diffraction grating layer 50 that interfaces with the P-type InP cladding layer 70, undulations are formed to provide a uniform, periodic variation in the thickness of the layer 50, whereby a diffraction grating 60 is provided.

In operation, a forward bias is applied between the P-side electrode 9 and the N-side electrode 10. This causes holes to be injected from the P-side electrode 9 and electrons from the N-side electrode 10. Recombination of holes and electrons, which takes place in the active layer 3, causes light to be generated. The indexes of refraction of the active layer 3 and the diffraction grating layer 50 are chosen to be relatively large, whereas those of the N-type InP cladding layer 2 and the P-type InP cladding layer 70 are relatively small, so that a waveguide structure can be formed by these layers. Accordingly, light generated propagates in the active layer 3, the diffraction grating layer 50, and their proximity in a direction parallel to the active layer 3 (i.e. in the horizontal direction in the drawing). Because the diffraction grating 60 is formed in the top surface of the diffraction grating layer 50, i.e. at the interface of the layer 50 with the cladding layer 70, the index of refraction effectively changes periodically in the direction of the extension of the diffraction grating 60 (i.e. in the horizontal direction in the drawing). By setting the period of the diffraction grating 60, i.e. the period of change of the index of refraction, to a period at which the generated light is subjected to Bragg reflection, only light at the wavelength at which the Bragg reflection condition is satisfied is repeatedly reflected within the waveguide structure to produce laser oscillations, and, thus, output light $h\nu$ is produced.

In this conventional DFB semiconductor laser 30, since the period of the diffraction grating 60 is uniform in the direction of the length L of the laser device (i.e. in the horizontal direction in the drawing), the coupling coefficient, which represents the fraction of light subject to the distributed feedback provided by the diffraction grating, is constant along the resonator direction (i.e. in the length L direction). As a result, the light intensity distribution within the resonator as indicated by a solid curve A in FIG. 4 is produced in which the intensity is relatively large near the center (0.5L) of the resonator. This may cause axial spatial hole burning during high power output operation, which, in turn, causes an unstable oscillation mode and prevents realization of a narrow spectral line width characteristic.

In an article "A New DFB-Laser Diode with Reduced Spatial Hole Burning" by G. Morthier et al. in IEEE *Photonics Technology Letters*, Vol. 2 No. 6, June 1990, Pages 388-390, results of theoretical computations are disclosed, which teach that in order to realize a DFB semiconductor laser providing a narrow spectral line width characteristic at high power output, it is necessary to vary the amplitude of the diffraction grating in the axial (i.e. length) direction of the resonator to thereby vary the coupling coefficient in that direction so that axial spatial hole burning can be prevented.

U.S. Pat. No. 5,020,072 issued to Y. Abe et al. on May 28, 1991, discloses a structure for facilitating highly reproducible production of DFB semiconductor lasers, and a semiconductor laser employing such structure which has a high power output, narrow spectral line width operation. In particular, in FIGS. 6a-6e of that patent, a DFB semiconductor laser is shown in which an interference fringe exposure technique and a chemical etching technique are utilized to form a diffraction grating of which the amplitude at the axial central portion of the resonator differs from the amplitude at the ends of the resonator. The coupling coefficient at the central portion is small relative to the coupling coefficient at the ends which results in suppression of light intensity in the central portion. Thus, axial spatial hole burning is suppressed, and, accordingly, a stable, high power, narrow spectral line width operation is achieved.

The article of Morthier et al. indicates that it is relatively difficult to fabricate a diffraction grating according to the mathematical analysis.

Manufacture of the structure disclosed in the aforementioned U.S. patent requires relatively precise control.

SUMMARY OF THE INVENTION

A major object of the present invention is to provide a semiconductor device with an improved diffraction grating formed therein.

Another object of the present invention is to provide a semiconductor laser which can be used as a light source in a long-distance, wideband optical communications system.

A further object of the present invention is to provide a semiconductor laser which exhibits a stable mode of oscillation and also a narrow spectral line width characteristic in high power operation.

A still further object of the present invention is to provide a DFB semiconductor laser with a uniform light intensity distribution along the axial (length) direction of a resonator to suppress axial spatial hole burning, so that the laser can be free of instabilities in oscillation mode and realize of a narrow spectral line width characteristic.

Still another object of the present invention is to provide a method of making, in a simple manner, a DFB semiconductor laser like the one stated above which exhibits a stable mode of oscillation and a narrow spectral line width characteristic even when it is operated at high output power.

These and other objects and advantages of the present invention will be understood from the following descriptions of the invention and the illustration of embodiments in the accompanying drawings.

A semiconductor device according to the present invention includes a substrate, a first cladding layer of a material having a relatively large energy band gap disposed on the substrate, an active layer of a material having a relatively small energy band gap disposed on the first cladding layer, and a second cladding layer of a material having a relatively large energy band gap disposed on said active layer. Stripes forming a diffraction grating layer are periodically juxtaposed in that portion of one of the cladding layers which is closer to the active layer. The diffraction grating layer has a multi-layered structure.

A semiconductor laser according to the present invention includes a substrate, a first cladding layer of a material having a relatively large energy band gap disposed on the substrate, an active layer of a material having a relatively small energy band gap disposed on the first cladding layer, and a second cladding layer of a material having a relatively large energy band gap disposed on the drive layer. Stripes forming a diffraction grating layer are periodically juxtaposed in that portion of one of the cladding layers which is closer to the active layer. The diffraction grating layer has a multi-layered structure. The first cladding layer, the active layer, the second cladding layer and the diffraction grating layer form a resonator. The multi-layered diffraction grating layer has portions along the axial direction, i.e. the length direction, of the resonator where the number of sub-layers forming the multi-layered structure is different from other portions.

The method of making a semiconductor device of the present invention is characterized in that a diffraction grating layer is configured as a multi-layered structure including a plurality of stacked sub-layers of semiconductor materials which are capable of being selectively etched, and that portions of the semiconductor material sub-layers are removed so as to produce juxtaposed stripes having a predetermined period.

DETAILED DESCRIPTION

Now, the present invention is described in detail with reference to some embodiments shown. It should be noted, however, that the present invention is not limited to these embodiments.

Embodiment 1

Figure 1:
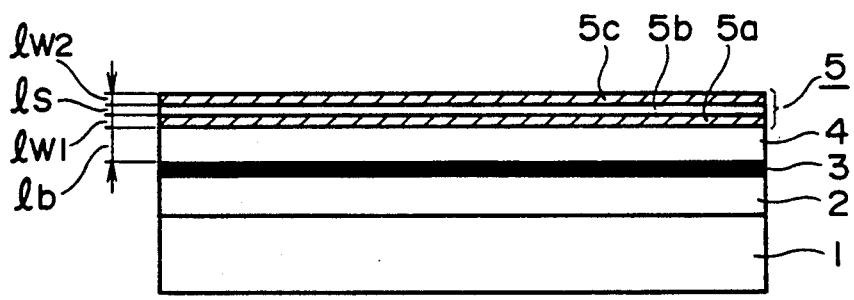
FIGS. 1(a) through 1(d) are cross-sectional views showing various steps in making a semiconductor laser, which is an example of a semiconductor device of the present invention.
Figure 1:
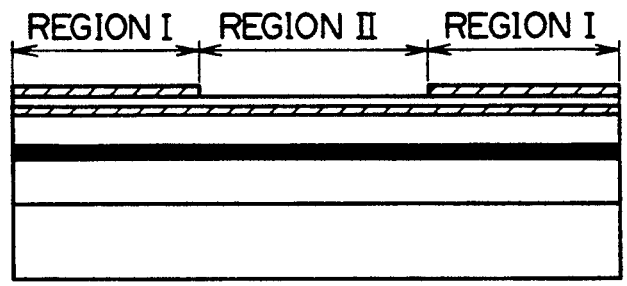
Figure 1:
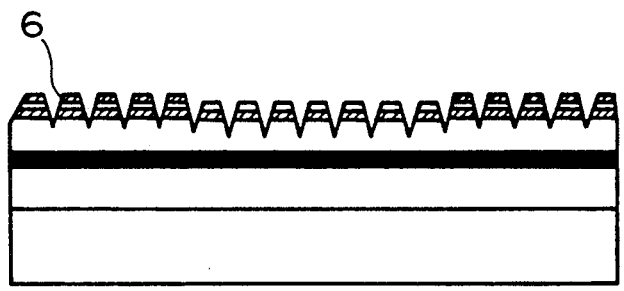
Figure 1:
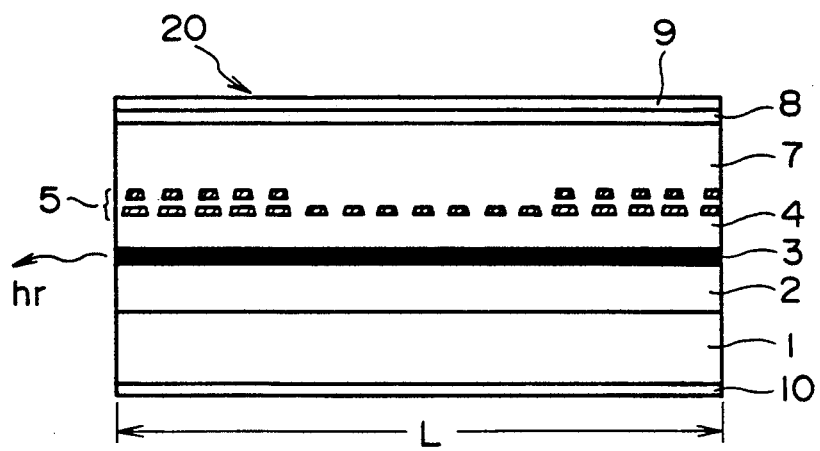

FIGS. 1(a), 1(b), and 1(c) show various steps in manufacturing a semiconductor laser which is an embodiment of the present invention, and FIG. 1(d) is a cross-sectional view of a completed semiconductor laser 20.

Figure 3:
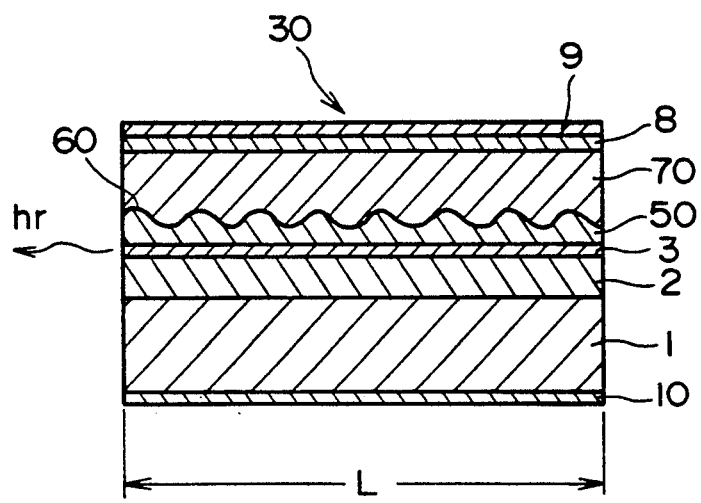
FIG. 3 is a cross-sectional view showing a basic structure of a prior art semiconductor laser comparable with the semiconductor laser of the present invention shown in FIG. 1(d)

In FIGS. 1(a)–1(d), the same reference numerals as the ones used in FIG. 3, which has been previously explained, designate similar or corresponding items or functions. As will be understood from FIG. 1(a) and FIG. 1(d) which shows the completed semiconductor laser, reference numerals 1, 2, 3, 8, 9, and 10 designate an N-type InP substrate, a first N-type InP cladding layer, an InGaAsP active layer, a P-type InGaAsP contact layer, a P-side electrode, and an N-side electrode, respectively. Reference numeral 4 designates a P-type InP barrier layer disposed on the InGaAsP active layer 3, and a diffraction grating layer 5 is disposed on the P-type barrier layer 4. The diffraction grating layer 5 includes a stack of three sub-layers, namely, a P-type InGaAsP sub-layer 5a, a P-type InP sub-layer 5b, and a P-type InGaAsP sub-layer 5c, which are stacked on the layer 4. The three stacked semiconductor sub-layers are processed in a manner which will be described later to form a diffraction grating 6. A second cladding layer 7 is disposed on the diffraction grating layer 5 and is formed of the same material as the barrier layer 4, i.e. P-type InP. The energy band gaps of the materials of the first P-type InP cladding layer 2, the P-type InP barrier layer 4, the diffraction grating layer 5, and the second P-type InP cladding layer 7 are larger than the energy band gap of the InGaAsP active layer 3. The indexes of refraction of the active layer 3 and the diffraction grating layer 5 are large relative to those of the first and second cladding layers 2, 7. The active layer 3, the diffraction grating layer 5, and the first and second cladding layers 2 and 7 together form a waveguide structure, and the layers 2, 3, 4, 5, and 7 together form an optical resonator.

Next, the process for making a semiconductor laser having the above-described structure is described.

First, the first N-type InP cladding layer 2, the InGaAsP active layer 3, the P-type barrier layer 4, the P-type InGaAsP sub-layer 5a, the P-type InP layer 5b, and the InGaAsP layer 5c are successively grown in the named order on the N-type InP substrate 1 to form the stack shown in FIG. 1(a). Any methods known in the semiconductor technical field may be used to grow the respective layers. The thicknesses of the barrier layer 4, the P-type InGaAsP sub-layers 5a and 5c, and the P-type InP sub-layer 5b are "lb", "lw$_1$", "lw$_2$", and "ls", respectively.

After that, by means of conventional photolithography, a mask pattern (not shown) with a window in a region II near the center of the resonator interposed between end regions I is disposed. The portion of the P-type InGaAsP sub-layer 5c exposed through the window in the region II is removed with an etchant consisting of sulfuric acid, an aqueous solution of hydrogen peroxide, and water. This etchant has substantially no effects on InP and, therefore, only the P-type InGaAsP sub-layer 5c is reproducibly and reliably removed. (See FIG. 1(b).) When it is necessary to selectively remove only the InP layer, an etchant consisting of phosphoric acid and hydrochloric acid may be used.

Then, using, for example, a two-beam interference fringe illumination technique, a pattern corresponding to the diffraction grating is projected onto the surface regions I and II of the structure. Then, a chemical etching technique which exhibits substantially no selectivity to InGaAsP and InP is employed for etching the structure to a depth which is greater than $(lw_1 + lw_2 + ls)$ but smaller than $(lw_1 + ls + lb)$. This results in the distributed feedback diffraction grating 6 comprising juxtaposed stripes each including portions of the sub-layers 5a, 5b and 5c in the regions I, and juxtaposed stripes including portions of the sub-layers 5a and 5b in the region II. (See FIG. 1(c).)

Thereafter, the second P-type InP cladding layer 7 and the P-type InGaAsP contact layer 8 are successively grown on the diffraction grating 6 (FIG. 1(d)). As stated previously, the P-type barrier layer 4 and the second P-type InP cladding layer 7 are formed of a material of the same composition, which results in the juxtaposed periodic stripes embedded in a P-type InP layer (comprising the layers 4 and 7). As stated above, the stripes in the regions I have a three-layer structure comprising the stacked sub-layers 5a, 5b, and 5c, while the stripes in the region I have a two-layer structure comprising the stacked sub-layers 5a and 5b. In the illustrated embodiment, the P-type InP sub-layer 5b and the second P-type InP cladding layer 7 are formed of the same material, the stripes in the region II may be said to comprise a single layer, namely, the InGaAsP sub-layer 5a. However, in general, the materials of the sub-layer 5b and the second cladding layer 7 need not have the same composition.

After that, the P-side electrode 9 and the N-side electrode 10 are respectively disposed on the top and bottom surfaces of the thus fabricated structure, which results in the completed semiconductor laser 20 shown in FIG. 1(d). The electrodes 9 and 10 can be made by any technique well known in the semiconductor technical field.

Now, the operation of the semiconductor laser 20 is described. First, as in the case of the semiconductor laser 30 shown in FIG. 3, a forward bias voltage is applied across the P-side electrode 9 and the N-side electrode 10. This causes carriers to be injected into the active layer 3. In other words, holes are injected from the P-side electrode 9 and electrons are injected from the N-side electrode 10, which are recombine in the active layer 3 to generate light. Since, as the previously described conventional semiconductor laser 30, the semiconductor laser 20 has a waveguide structure, generated light propagates in the direction parallel to the active layer 3. The the barrier layer 4 is so thin that generated light goes sufficiently into the diffraction grating layer 5. Then light going into the diffraction grating layer 5 is affected by the periodic variation in equivalent index of refraction of the diffraction grating 6 formed by the periodic stripes and is subjected to Bragg reflection. Thus, laser oscillation occurs.

The coupling coefficient representing the proportion of distributed fed back light is mainly determined by the distance between the active layer 3 and the diffraction grating 6, and the amplitude of the diffraction grating 6. In the semiconductor laser 20 of this embodiment, the distance between the active layer 3 and the diffraction grating 6 is determined by the thickness of the barrier layer 4, which is 1b in both the regions I and the region II. On the other hand, the amplitude of the diffraction grating 6 is determined by the configuration of the multi-layer structure of the diffraction grating layer 5 and the number of stacked sub-layers forming the layer 5. The multi-layer structure is a three-layer structure comprising a stack of the sub-layers InGaAsP/InP/InGaAsP (i.e. the sub-layers 5a, 5b, 5c) in the regions I, and is a two-layer structure comprising InP/InGaAsP (i.e. the sub-layers 5a, 5b) in the region II. Accordingly, the coupling coefficient is larger in the regions I, while it is smaller in the region II.

Figure 2:
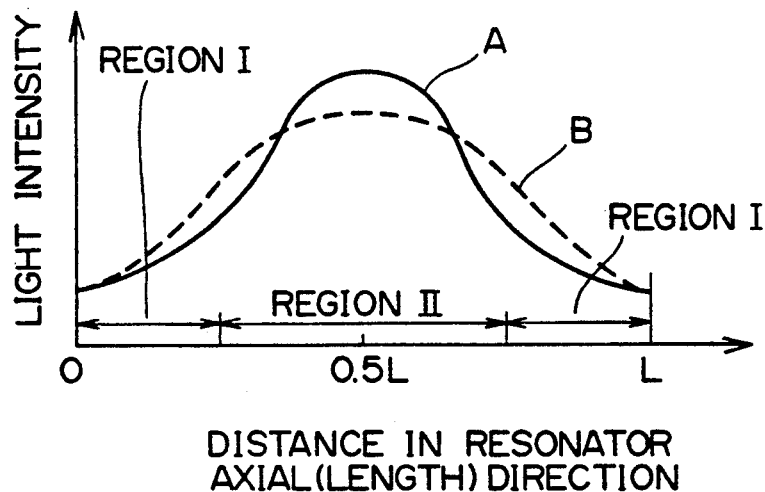
FIG. 2 shows a light intensity distribution within the resonator of the completed semiconductor laser of the shown in FIG. 1(d)
Figure 4:
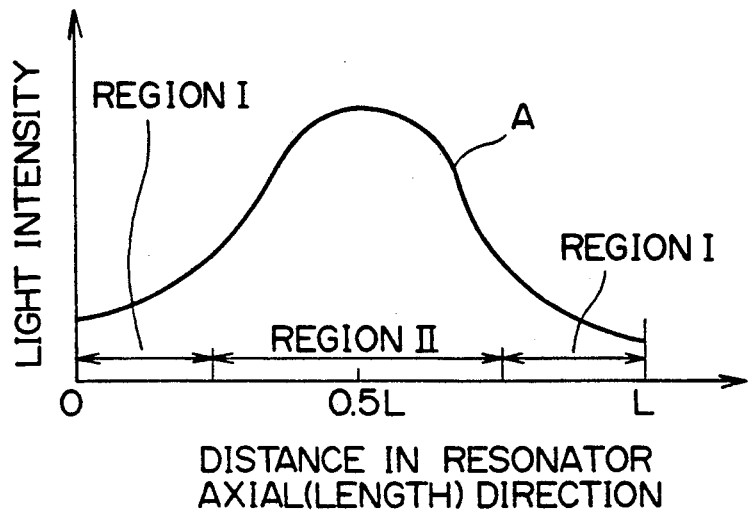
FIG. 4 shows a light intensity distribution within the resonator of the prior art semiconductor laser shown in FIG. 3.

The light intensity distribution along the length (L) direction of the resonator of the semiconductor laser of the above-described structure is indicated by a broken-line curve B in FIG. 2. In comparison with a solid-line curve A which indicates the intensity distribution of the conventional semiconductor laser (the same curve as the curve A shown in FIG. 4), the intensity is enhanced in the regions I and is reduced in the region II.

In the conventional laser, the light intensity is significantly larger near the midpoint of the length L of the resonator (i.e. in the mid portion of the region II) as shown by the curve A, and, therefore, at high output power, mode instability caused by axial spatial hole burning is disadvantageously exhibited, as explained previously. One solution proposed is to decrease the coupling coefficient over the entire structure. However, with a reduced coupling coefficient, the amount of light fed back is also reduced, which produces a new problem of an increase in the threshold current.

In contrast to such a solution, according to the present invention, the semiconductor laser 20 with the structure shown in FIG. 1(d) has a larger coupling coefficient in regions (regions I) near the end surfaces where the light intensity is small, and has a smaller coupling coefficient in the center region (region II) where the light intensity is large. This makes it possible to realize a substantially uniform light intensity distribution in the resonator without reducing the amount of fed back light, by suppressing the increase of (i.e. reducing) the light intensity in the center region (region II), while increasing the intensity near the end surface regions (regions I). Thus, the semiconductor laser 20 of the present invention, even when operating at high output power, is free of axial spatial hole burning so that its mode of oscillation is stable.

Usually, the dimensions of a diffraction grating formed in a DFB semiconductor laser are very minute. For example, the period of the stripes is about 0.2 $\mu$m, and the depth of the intervening grooves is about 0.1 $\mu$m or less. Accordingly, with the conventional semiconductor laser structure, in order to change the depth of the diffraction grating, the etching process, for example, must be very precisely controlled, which is difficult to achieve. However, according to the present invention, any desired depth can be easily obtained by selectively uniformly etching desired one or ones of sub-layers which form the multi-layered diffraction grating layer 5. Thus, any desired dimensions can be easily realized.

Embodiment 2

In place of the three-layer structure comprising InGaAsP/InP/InGaAsP for the diffraction grating layer 5 of Embodiment 1, the layer 5 may comprise a stack of two sub-layers, four or more sub-layers. It may be, for example, an InGaAsP/InP/InGaAsP/InP/InGaAsP five-layer structure.

Embodiment 3

In the semiconductor laser of Embodiment 1, only two different coupling coefficients are employed for the regions I and the region II. However, the resonator may be partitioned into a larger number of regions within the limit of the number of the stacked sub-layers of the diffraction grating layer 5 in which regions different coupling coefficients are exhibited.

Embodiment 4

The diffraction grating of the semiconductor laser of Embodiment 1 has a phase which is uniform along its length. By employing a diffraction grating of which the phase in the center region of the resonator is shifted by one quarter wavelength, a λ/4 shifted distributed feedback semiconductor laser can be realized. Generally, a λ/4 shifted DFB semiconductor laser tends to have a light intensity increased particularly in a resonator central region and, therefore, is subject to axial spatial hole burning in high output operation. Accordingly, the application of the present invention to such λ/4 shifted DFB semiconductor lasers is very advantageous.

Embodiment 5

The semiconductor laser of Embodiment 1 has such a structure that the coupling coefficients in regions near the end surfaces (i.e. regions I), where the light intensity is small, are large, whereas the coupling coefficient in a region near the center (i.e. region II), where the light intensity is large, is small, with the coupling coefficients in the regions near the end surfaces being equal to each other. However, the number of stacked sub-layers may be different between the regions near the two end surfaces to thereby provide different coupling coefficients in those regions. With such a structure, the light output from the end surface where the coupling coefficient is smaller is larger than the light output from the end surface with a larger coupling coefficient.

Embodiment 6

Instead of the InGaAsP single-layer active layer 3 of Embodiment 1, a multi-layer structure, such as an InGaAs/InGaAsP multiple quantum well layer, may be used which can provide the same effects as provided by the semiconductor laser of Embodiment 1.

Embodiment 7

The semiconductor laser of Embodiment 1 employs a conductive N-type InP substrate. However, the use of the diffraction grating structure of Embodiment 1 for a laser with a conductive P-type InP substrate or a semi-insulating InP substrate can provide the same advantages as described for Embodiment 1.

Embodiment 8

The semiconductor laser of Embodiment 1 uses InGaAsP as a main semiconductor material therefor, but the diffraction grating structure of the present invention can be used for devices which comprise other known compound semiconductor materials, such as AlGaInAs and AlGaAs/GaAs materials.

Embodiment 9

The device of Embodiment 1 is a DFB semiconductor laser, but the diffraction grating structure used in Embodiment 1 can be also used other semiconductor devices which take advantage of a diffraction grating, such as a distributed Bragg reflection semiconductor laser, a waveguide grating filter, and a reflection grating deflector.

Embodiment 10

Embodiment 1 is an example of a single semiconductor device which has different coupling coefficients within its resonator. However, this invention is also applicable when a plurality of semiconductor lasers with different coupling coefficients are formed on a single semiconductor wafer, which facilitates simultanous fabrication of different types of devices by the same manufacturing steps.

As is clear from the above description made with reference to some embodiments, semiconductor devices of the present invention are configured such that a diffraction grating layer including periodically arranged stripes is formed in a cladding layer located near and having a larger energy band gap than an active layer, and the diffraction grating layer has a multilayer structure formed of a plurality of semiconductor sub-layers with the number of sub-layers being different from region to region along the length of the resonator so as to provide desired coupling coefficients. This structure can provide a narrow spectral line width characteristic in high output power operation.

Furthermore, since, according to the manufacturing method of the present invention, a diffraction grating layer is formed of a stack of sub-layers of different semiconductor materials which can be individually etched selectively, and desired portions of desired sub-layers are selectively removed by etching to produce stripes, semiconductor devices with high reproducibility and uniform quality can be easily manufactured.

What is claimed is:

1. A semiconductor device comprising:
   an active layer of a semiconductor material having an energy band gap, the active layer extending along a length direction of said semiconductor device;
   a cladding layer disposed on said active layer, said cladding layer comprising a semiconductor material having an energy band gap larger than the energy band gap of the semiconductor material of said active layer; and
   a diffraction grating layer including periodically arranged parallel stripes disposed within a portion of said cladding layer close to said active layer wherein said diffraction grating layer has a multilayer structure comprising a stack of sub-layers of at least two semiconductor materials having, respective energy band gaps and which can be mutually selectively etched and the number of said sub-layers differs along the length direction of said active layer.

2. A semiconductor device according to claim 1 wherein the energy band gaps of the semiconductor materials of said sub-layers of said diffraction grating layer are substantially larger than the energy band gap of the semiconductor material of said active layer.

3. A semiconductor device according to claim 1 wherein said semiconductor device comprises a second cladding layer of a semiconductor material disposed on said active layer opposite said first cladding layer, said second cladding layer having a larger energy band gap than the semiconductor material of said active layer.

4. A semiconductor laser comprising:
   an active layer of semiconductor material having an energy band gap, the active layer extending in a direction along which light generated in said laser propagates;
   a first cladding layer disposed on said active layer, the material of said first cladding layer having a larger energy band gap than the semiconductor material of said active layer; and
   a second cladding layer disposed on said active layer opposite said first cladding layer, the material of said second cladding layer having a larger energy band gap than the semiconductor material of said active layer, wherein said second cladding layer includes, close to said active layer, a diffraction grating layer including periodic parallel stripes, said diffraction grating layer has a multi-layer structure comprising a stack of sub-layers of at least two semiconductor materials having respective energy band gaps and which can be mutually selectively etched, the energy band gaps of the semiconductor materials of said sub-layers of said diffraction grating layer are substantially larger than the energy band gap of the semiconductor material of said active layer, and the number of said sub-layers varies along the direction of propagation of light generated within said active layer.

5. A semiconductor laser comprising:
   an active layer of semiconductor material having an energy band gap, the active layer extending in a direction along which light generated in said laser propagates;
   a first cladding layer disposed on said active layer, the material of said first cladding layer having a larger energy band gap than the semiconductor material of said active layer; and
   a second cladding layer disposed on said active layer opposite said first cladding layer, the material of said second cladding layer having a larger energy band gap than the semiconductor material of said active layer, wherein said second cladding layer includes, close to said active layer, a diffraction grating layer including periodic parallel stripes, said diffraction grating layer has the same conductivity type as said second cladding layer and a multilayer structure comprising a stack of sub-layers of at least two semiconductor materials having respective energy band gaps which can be mutually selectively etched, the energy band gaps of the semiconductor materials of said sub-layers of said diffraction grating layer are substantially larger than the energy band gap of the semiconductor material of said active layer, and the number of said sub-layers of said diffraction grating layer is smaller in a central region and larger in each of two end regions of said laser oriented along the direction of propagation of light generated in said active layer so that said central region has a first coupling coefficient and said end regions have a second coupling coefficient larger than the first coupling coefficient.

6. A semiconductor laser according to claim 5 wherein the number of said sub-layers in said end regions is selected such that the coupling coefficient in one of said end regions is larger than the coupling coefficient of the other end region.

7. A semiconductor laser according to claim 5 including a quarter wavelength phase-shifted portion in said central region.

8. A semiconductor device comprising:
   a semiconductor substrate and a plurality of semiconductor lasers in said semiconductor substrate, each of said semiconductor lasers comprising:
   an active layer of a semiconductor material having an energy band gap;
   a first cladding layer disposed on said active layer, the material of said first cladding layer having a larger energy band gap than the semiconductor material of said active layer; and
   a second cladding layer disposed on said active layer opposite the first cladding layer, the material of said second cladding layer having a larger energy band gap than the semiconductor material of said active layer, said second cladding layer including, close to said active layer, a diffraction grating layer including periodic parallel stripes, said diffraction grating layer having a multi-layer structure comprising a stack of sub-layers of at least two semiconductor materials having respective energy band gaps and which can be mutually selectively etched, the energy band gaps of the semiconductor materials of said sub-layers of said diffraction grating layer being substantially larger than the energy band gap of the semiconductor material of said active layer;, and the number of said sub-layers of said diffraction grating layer of at least one of said semiconductor lasers is different from the number of sub-layers of the remaining semiconductor lasers.

9. A method of manufacturing a semiconductor laser comprising:
   successively growing, in the named order, on a first cladding layer of a semiconductor material having an energy band gap and a first conductivity type, an active layer of a semiconductor material having a smaller energy band gap than said first cladding layer, a barrier layer of a semiconductor material having a second conductivity type and having a larger energy band gap than said active layer, and a diffraction grating layer having a multi-layer structure including a stack of sub-layers of a plurality of semiconductor materials having the same conductivity type as the semiconductor material of said barrier layer and having larger energy band gaps than the semiconductor material of said active layer, said materials of said sub-layers being mutually selectively etchable;
   selectively etching at least one portion of the surface of said diffraction grating layer to remove at least a selected sub-layer in that portion;
   forming parallel grooves in the surface of said diffraction grating layer, said grooves extending to said barrier layer to produce parallel stripes having a predetermined period; and
   growing a second cladding layer of a semiconductor material on said diffraction grating layer including said parallel stripes, the semiconductor material of said second cladding layer being the same material and having the same conductivity type as the material of said barrier layer.

* * * * *